United States Patent [19]
Lee

[11] Patent Number: 5,883,851
[45] Date of Patent: Mar. 16, 1999

[54] SEMICONDUCTOR MEMORY DEVICE AND A READING METHOD THEREOF

[75] Inventor: Jin-Young Lee, Seoul, Rep. of Korea

[73] Assignee: Samsung Electronic Co., Ltd., Suwon, Rep. of Korea

[21] Appl. No.: 44,396

[22] Filed: Mar. 18, 1998

[30] Foreign Application Priority Data

Mar. 18, 1997 [KR] Rep. of Korea ............... 1997-9190

[51] Int. Cl.[6] ............................................. G11C 8/00
[52] U.S. Cl. ........................ 365/230.03; 365/230.06; 365/193; 365/196; 365/233
[58] Field of Search ............... 365/230.03, 230.06, 365/193, 196, 233

[56] References Cited

U.S. PATENT DOCUMENTS 5,276,649   1/1994   Hoshita et al. ................... 365/206
5,715,208   2/1998   Casper et al. .................. 365/230.08
5,719,814   2/1998   Ishikawa ........................... 365/205

*Primary Examiner*—David Nelms
*Assistant Examiner*—VanThu Nguyen
*Attorney, Agent, or Firm*—Marger Johnson & McCollom P.C.

[57] ABSTRACT

In a semiconductor memory device, there is provided a column detecting circuit for generating a detection signal DETIO when respective voltage levels on a pair of I/O lines IO and IOB are developed into predetermined voltage levels which can be sensed as a valid data by external circuitry. Thereafter, a block selecting circuit and a sensing control signal generating circuit are respectively disabled by the detection signals DETIO and DETIOB causing a bit line precharge operation to be performed during a reading operation Thus, the sensing consumed by sense amplifiers during the reading operation period is reduced. In addition, since the bit line precharge operation is performed during the reading operation period, the bit line precharge time is reduced.

14 Claims, 9 Drawing Sheets

SEMICONDUCTOR MEMORY DEVICE AND A READING METHOD THEREOF

FIELD OF THE INVENTION

The present invention relates to a semiconductor memory device for reducing the sensing current consumed during a read operation and a reading method thereof.

BACKGROUND OF THE INVENTION

FIG. 1 is a block diagram showing a conventional semiconductor memory device. FIG. 2 is a timing diagram of a reading operation for the conventional semiconductor memory device shown in FIG. 1. Referring to FIG. 1, a memory cell array 100 includes a plurality of blocks (not shown), each of which includes a plurality of rows, a plurality of columns, and a plurality of memory cells. Each of the plurality of memory cells are formed at the intersections between the plurality of columns and the plurality of rows. The rows and columns include a plurality of word lines and bit lines, respectively. For example, the memory cells and the word lines in a dynamic random access memory (DRAM) device are organized in accordance with a hierarchical word line scheme that is well known to those skilled in the art. The word lines may be divided into sub-word lines and main word lines wherein a proportion of the main word lines to the sub-word lines is 1:y (y is an integer number).

A row address buffer 110 receives external addresses An (n is an integer) having a TTL (transistor-transistor logic) voltage level. The addresses An are synchronized with a row address strobe RAS signal, and generates row addresses RAm (m is an integer) having a CMOS (Complementary Metal Oxide Semiconductor) voltage level as shown in FIG. 2. A row predecoder 120 decodes the row addresses RAm provided from the row address buffer 110. A block selecting circuit 130 generates a first selection signal BLSk as the block selection-information (e.g., DRA0 and DRA1) of the row addresses Ram are decoded by the row predecoder 120. A row decoder 140 selects and drives a row related to the first selection signal BLSk. A second selection signal DCAij selects one of rows in the selected block. As a result, respective voltage levels on a pair of bit lines BL and BLB, as depicted in FIG. 2, are developed in accordance with data (e.g., logic '1' or logic 0) stored in an addressed memory cell.

Furthermore, when the row address strobe RASB signal is activated, a master clock generating circuit 160 generates a master clock PRD as a pulse signal. The phase of the master clock PRD is complementary to the row address strobe RASB signal. A sensing control signal generating circuit 170 generates a sensing control signal PS. The sensing control signal PS indicates a period when a sensing operation of the addressed memory cell is performed. A sensing enable signal generating circuit 180 generates two complementary sensing enable signals LANG and LAPG. Thus, a sense amplifier(s) (not shown in FIG. 1) in a bit line precharge/sense amplifier circuit 230 is enabled by the sensing enable signals LANG and LAPG. The sense amplifier(s) senses the voltage levels on a pair of the developed bit lines BL and BLB and to amplify the sensed voltage levels into power supply voltage Vcc and ground voltage Vss or into ground voltage Vss and power supply voltage Vcc in accordance with data stored in the addressed memory cell.

The semiconductor memory device 1000 depicted in FIG. 1, includes a plurality of column selection lines (not shown). The column selection lines may be organized in accordance with the hierarchical column selection scheme. For example, the column selection lines may be divided into local column selection lines and global column selection lines. The proportion of the local column selection lines to the global column selection lines is 1:z (z is an integer).

Next, as shown in FIG. 2, when a column address strobe CASB signal changes from a low level to a high level, a column address buffer 190 receives the external addresses An having TTL voltage levels. The external addresses An are synchronized with the column address strobe CASB signal. The column address buffer 190 generates column addresses CA1 (1 is an integer) having a CMOS voltage level. A column main decoder 200 generates a first column selection signal DCA01 for selecting among the column addresses Ca1 (e.g., CA0 and CA1). A column predecoder 210 generates a second column selection signal DCAij as local selection information decoding other column addresses among the column addresses CA1.

A column decoder 220 selects a column selection line CSL (i.e., a local column selection line (not shown)), so that data sensed and amplified by the sense amplifier (not shown) is provided to corresponding input/output (I/O) lines through an I/O gating circuit 240 controlled by the column decoder 220.

As shown in FIG. 2, when the column address strobe CASB signal is disabled, signals CA1, DCAcd, DCA01, CSLx, and the like related to the column selection operation are disabled. When the row address strobe RASB signal is disabled, signals PRD, PS, LANG, LAPG, and the like related to the row selection operation are disabled. If the block selecting circuit 130 is inactivated, all the bit lines of the selected block of the semiconductor memory device 1000 are precharged to a predetermined level (e.g., ½ Vcc) because the precharge signal generating circuit 150 is activated by the first selection signal BLSk disabled in accordance to the row address strobe RASB signal.

According to the conventional semiconductor memory device 100 as described above, after the data stored in the addressed memory cell is output to the I/O lines (e.g., IO and IOB), a sensing operation related to the addressed memory cell continues to be performed because the sensing enable signals LANG and LAPG are enabled by the row address strobe RASB signal. By so operating, current continues to be consumed by the sense amplifier(s) in the bit line precharge/sense amplifier circuit 230 during the sensing operation until the row address strobe /RASB is disabled.

SUMMARY OF THE INVENTION

It is therefore an object of the present invention to provide a semiconductor memory device that overcomes the problems associated with prior art memory devices.

It is another object of the present invention to provide a semiconductor memory device capable of reducing the current consumed by the sense amplifier circuit during the data reading operation and a reading method thereof.

It is yet another object of the invention to provide a semiconductor memory device capable of reducing a bit line precharge time and a reading method thereof.

In order to attain the above objects, according to an aspect of the present invention, there is provided a semiconductor memory device comprises a memory cell array having a plurality of blocks each of which has a plurality of memory cells arranged in rows and columns; a plurality of first column selection lines corresponding to the memory cell array; a plurality of second column selection lines corresponding to each block; a decoding means for decoding a column address for one of the second column selection lines to generate a first and second column selection signals; a selecting means for selecting one of the second column selection lines in response to the first and second column selection signals; a sense amplifier means for sensing and amplifying a cell data held by a memory cell related to a row address and the column address in response to sensing enable signals; a sensing control signal generating means responsive to a pulse signal synchronized with a row address strobe signal, for generating a sensing control signal indicating a period during which a sensing operation related to the addressed memory cell is performed; a sensing enable signal generating means for generating the sensing enable signals in response to the sensing control signal; a detecting means for detecting whether the first column selection signal is activated and outputting a detection signal when voltage levels on I/O lines corresponding to the selected column are developed into enough voltage level to be externally sensed as a valid data. In this device, while the row address strobe signal is enabled, the sensing control signal generating means and the sensing enable signal generating means are disabled by the detection signal in turn.

According to another aspect of the present invention, a semiconductor memory device comprises a memory cell array having a plurality of blocks each of which has a plurality of rows, a plurality of columns, and a plurality of memory cells which are arranged in the rows and columns; a plurality of first column selection lines corresponding to the memory cell array; a plurality of second column selection lines corresponding to each block, wherein proportion of the first column selection lines to the second column selection lines is 1:n; a first decoding means for decoding a row address corresponding to one of the rows to generate a first selection signal as block selection-information and a second selection signal as row selection-information; a row selecting means for selecting the addressed row in response to the first and second selection signals; a second decoding means for decoding a column address corresponding to one of the second column selection lines to generate a first column selection signal as first column selection-information and a second column selection signal as second column selection-information; a column selecting means for selecting one of the second column selection lines in response to the first and second column selection signals; a sense amplifier means for sensing and amplifying a cell data held by a memory cell related to the row and column addresses in response to sensing enable signals; a sensing control signal generating means, in response to a pulse signal synchronized with a row address strobe signal for generating a sensing control signal indicating a period during which a sensing operation related to the addressed memory cell is performed; a sensing enable signal generating means for generating the sensing enable signals in response to the sensing control signal; a detecting means for detecting whether the first column selection signal is activated and outputting a detection signal when a voltage level on IO line corresponding to the selected column is developed into a voltage level capable of being sensed as a valid data at external; wherein while the row address strobe signal is enabled, the sensing control signal generating means and the second decoding means are disabled by the detection signal.

According to a further aspect of the present invention, a reading method of a semiconductor memory device including a memory cell array having a plurality of memory cells arranged in rows and columns, said reading method comprises the steps of detecting whether a row address strobe signal is enabled, the row address strobe signal indicating that a row address for addressing one of the rows is input; activating the addressed row and a sense amplifier corresponding to the addressed row in turn so that a sensing operation of the addressed row is performed; detecting whether a column address strobe signal is enabled, the column address strobe signal indicating that a column address is input and selecting a column selection line corresponding to the column address; and detecting whether the column selection line is selected and a voltage level on a I/O line corresponding to the selected column selection line is developed into a voltage level capable of being sensed as a valid data at external and disabling the sense amplifier while the row address strobe and the column address strobe signals are activated.

BRIEF DESCRIPTION OF THE DRAWINGS

The foregoing and other objects, features, and advantages of the invention will become more readily apparent from the following detailed description of a preferred embodiment that proceeds with reference to the following drawings.

DESCRIPTION OF THE PREFERRED EMBODIMENT

Figure 3:
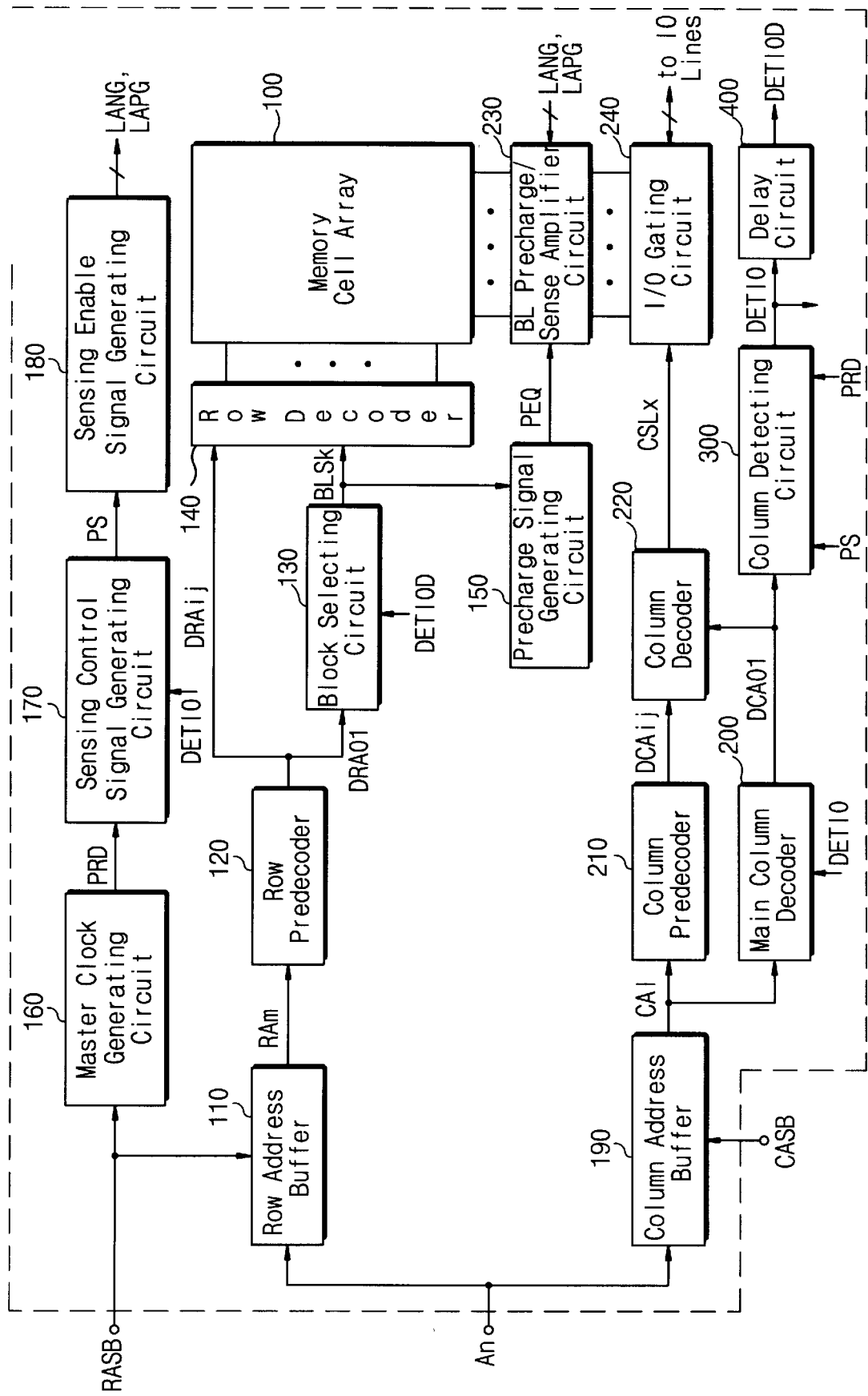
FIG. 3 is a block diagram of a semiconductor memory device according to the present invention.

FIG. 3 is a block diagram of a semiconductor memory device according to the present invention. Referring to FIG.

3, there is provided a column detecting circuit 300 for generating a detection signal DETIO when respective voltage levels on a pair of I/O lines IO and IOB reach a predetermined voltage level that can be sensed as a valid data. A block selecting circuit (sometimes called 'main row decoder') 130 and a sensing control signal generating circuit 170 are respectively disabled by the detection signals DETIOD and DETIO thereby initiating precharging of the bit lines during a reading operation. Thus, it is possible to reduce the sensing current consumed by sense amplifiers during the reading operation period. In addition, since the bit lines are precharged during the reading operation period, the bit line precharge time is shorten.

Figure 1:
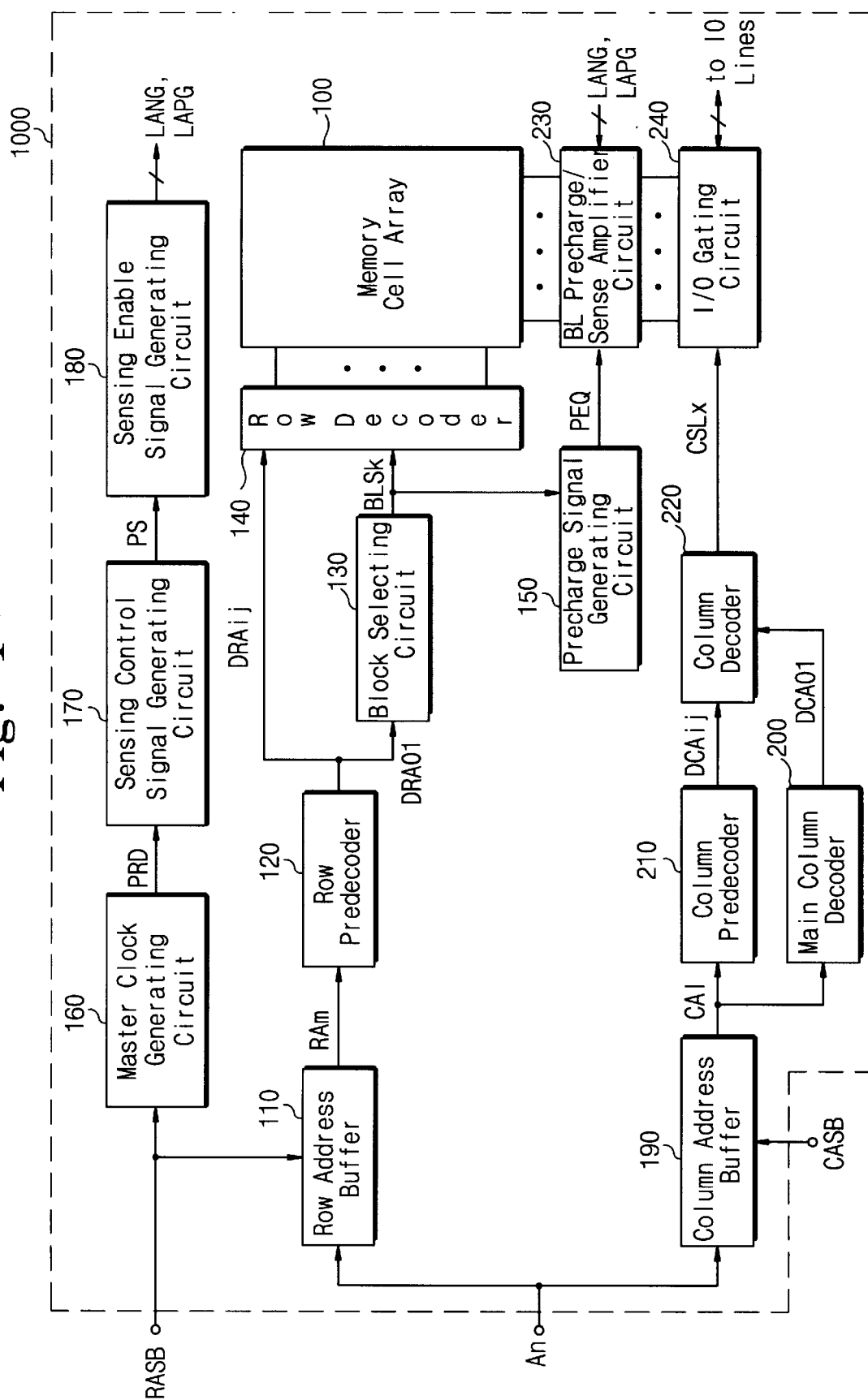
FIG. 1 is a block diagram of a conventional semiconductor memory device.
Figure 2:
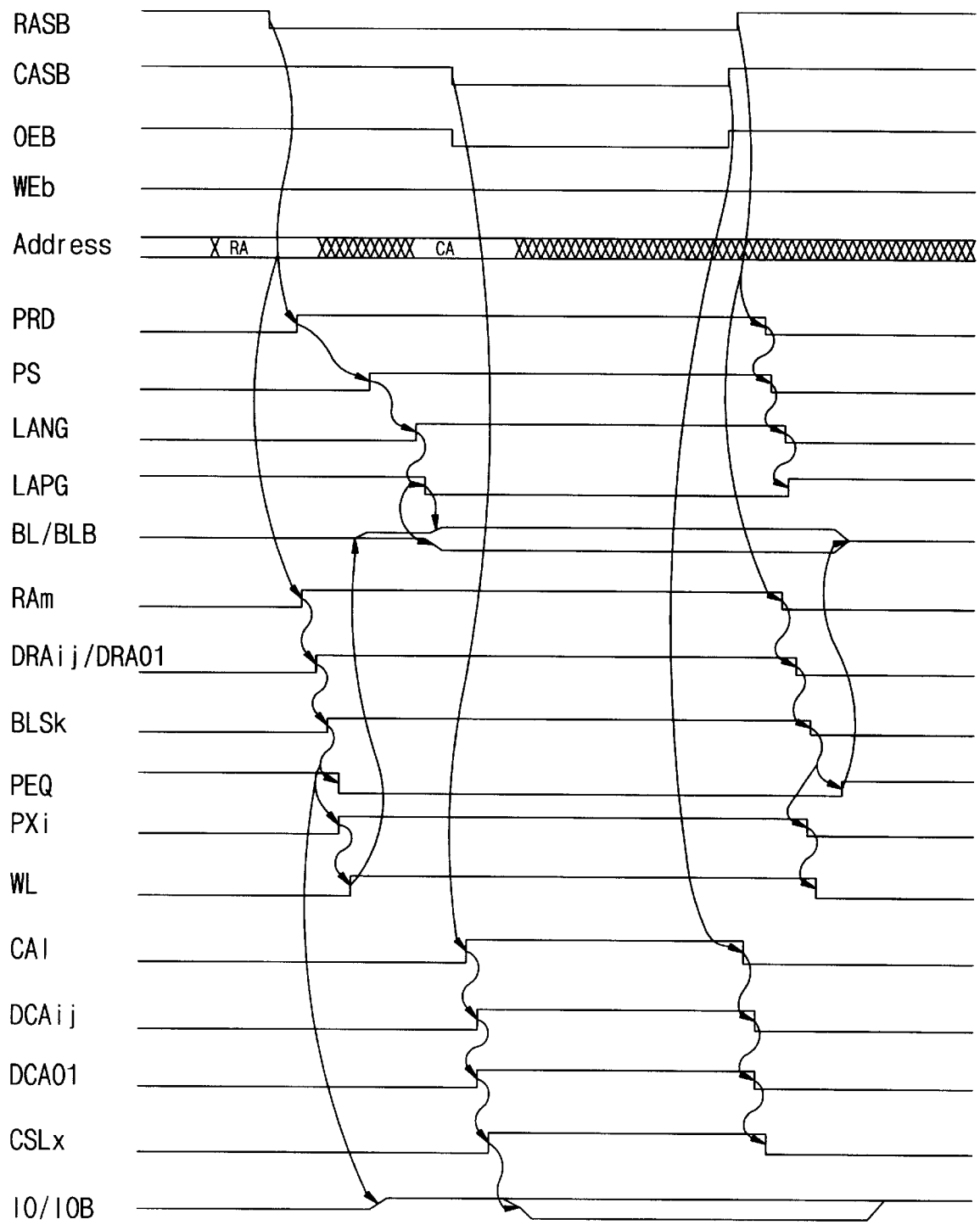
FIG. 2 is a timing diagram of a data reading operation for the conventional semiconductor device shown in FIG. 1.

A preferred embodiment of this invention will be described in detail with reference to the accompanying drawings. In FIG. 3, the components that are identical with those shown in FIG. 1 are labeled with the same reference numerals. The column detecting circuit 300 detects whether a first column selection signal DCA01, serving as a global selection information, is activated during a reading operation. The circuit 300 generates the detection signal DETIO having a logic high voltage level after a predetermined time interval. During the predetermined time interval, the voltage levels on the I/O lines IO an IOB related to the addressed memory cell are developed into voltage levels capable of being externally sensed as a valid data. The detection signal DETIO is generated responsive to the first column selection signal DCA01. The detection signal DETIO is delayed by a delay circuit 400 thereby generating a delayed signal DETIOD. The block selecting circuit 130 and the sensing control signal generating circuit 170 are disabled by the detection signals DETIOD and DETIO having logic high voltage levels, respectively. This causes a sensing enable signal generating circuit 180 to inactivate sense amplifiers (not shown) in a bit line precharge/sense amplifier circuit 230 and a bit line precharge signal generating circuit 150 to activate a bit line precharging and equalizing section in the circuit 230 (portion 232 shown in FIG. 4.). At this time, the main column decoder 200 is disabled by the detection signal DETIO having a logic high voltage level. The main column decoder, in turn, disables the column decoder 220 and the I/O gating circuit 240.

As a result, in a reading operation of an addressed memory cell, a related sensing operation is completed when the voltage levels on I/O lines IO and IOB are developed into voltage levels (e.g., I/O voltage level) capable of being sensed by external circuitry as a valid data. Therefore, the sensing current that is consumed by a sense amplifier(s) in the circuit 230 is reduced. Furthermore, reducing the precharge time is possible since the bit lines are precharged during the reading operation period.

Figure 4:
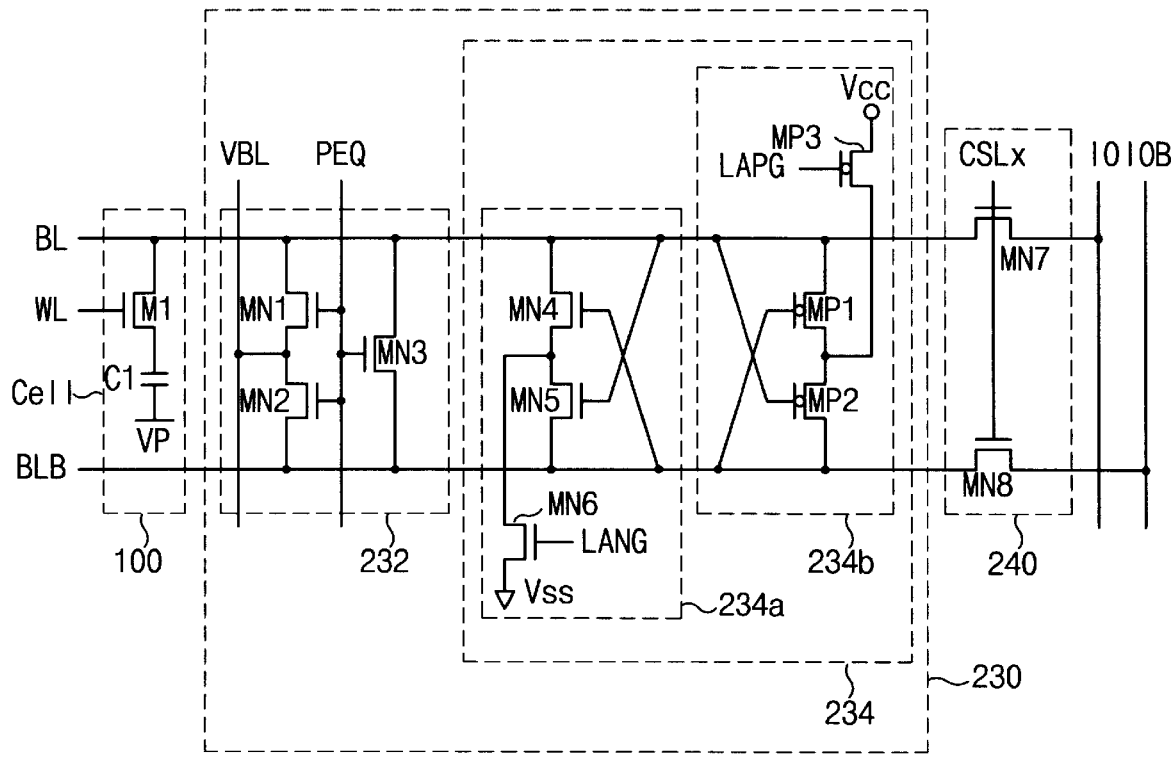
FIG. 4 is a circuit diagram of a bit line precharge/sense amplifier circuit for the semiconductor memory device shown in FIG. 3.

FIG. 4 shows a detailed circuit construction of the bit line precharge/sense amplifier circuit 230 and the P/O gating circuit 240 of FIG. 3. In FIG. 4, only the circuits corresponding to a pair of bit lines BL and BLB as shown. Referring to FIG. 4, the bit line precharge/sense amplifier circuit 230 includes a bit line precharging and equalizing section 232 and a sense amplifier 234. The bit line precharging and equalizing section 232 is controlled by a control signal PEQ generated by the bit line precharge signal generating circuit 150. The bit line precharging and equalizing section 232 so both precharges and equalizes the bit lines BL and BLB at voltage level VBL (e.g., ½ Vcc) before a sensing operation is performed. The bit line precharging and equalizing section 232 includes three NMOS transistors MN1, MN2 and MN3 as shown.

The sense amplifier 234 is controlled by two sensing enable signals LANG and LAPG generating the sensing enable signal generating circuit 180. The sense amplifier 234 comprises an N-latch sense amplifier 234a and a P-latch sense amplifier 234b. The N-latch sense amplifier 234a includes three NMOS transistors MN4, MN5, and MN6 and the P-latch sense amplifier 234b includes three PMOS transistors MP1, MP2, and MP3. When the sensing enable signals LANG and LAPG are at logic low and high voltage levels, respectively, the sense amplifier 230 is inactivated. When the sensing enable signals LANG and LAPG are at logic high and low voltage levels, respectively, the sense amplifier 230 is activated so that voltage difference between the bit lines BL and BLB can be sensed and the sensed voltage difference is amplified into power supply voltage Vcc and ground voltage Vss or into ground voltage Vss and power supply voltage Vcc, respectively.

The I/O gating circuit 240 comprises two NMOS transistors MN7 and MN8 controlled by the column selection line CSL. The I/O gating circuit 240 connects the bit lines BL and BLB with the corresponding I/O lines IO and IOB, respectively, responsive to the column selection line CSLx.

Figure 5:
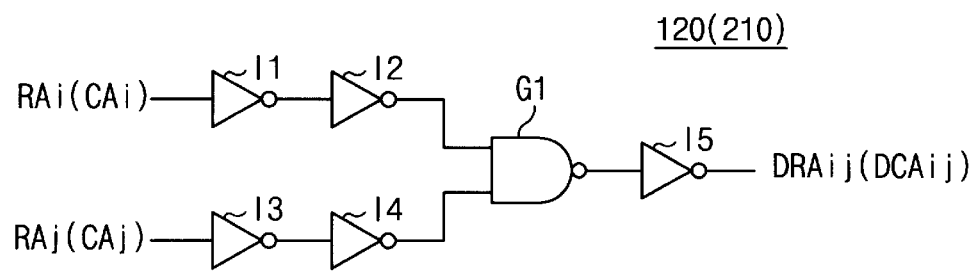
FIG. 5 is a detailed circuit diagram of a row/column predecoder for the semiconductor memory device shown in FIG. 3.

A detailed circuit diagram of the row predecoder 120 is shown in FIG. 5. The column predecoder 210 has the same construction as the row predecoder 120. In FIG. 5, the row or column predecoder 120 or 210 comprises five inverters I1 to I5 and a NAND gate G1. The row and column predecoder 120 and 210 decodes signals RAi or Cai, respectively, and RAj and Caj, respectively, to generate a decoded signal DRAij and DCAij. For instance, the predecoder 120 decodes addresses RA0 and RA1B and generates a decoded signal DRA01B (or DCA0B1). The predecoder 210 decodes addresses CAOB and CA1 and generates a decoded signal DCA0B1.

Figure 6:
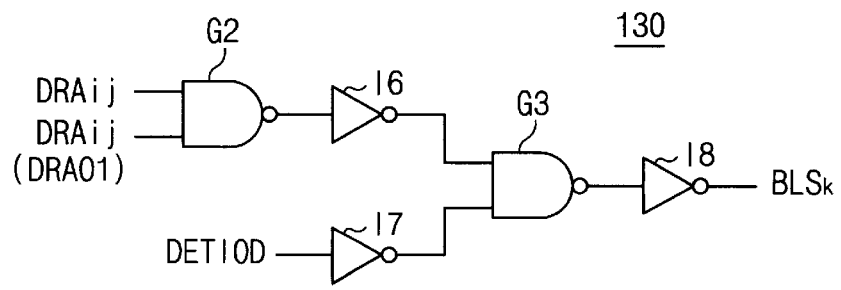
FIG. 6 is a detailed circuit diagram of a block selecting circuit for the semiconductor memory device shown in FIG. 3.

FIG. 6 is a detailed circuit of an embodiment of the block selecting circuit 130. Referring to FIG. 6, the block selecting circuit 130 comprises three inverters I6 to I8 and two NAND gates G2 and G3. The decoder 130 generates the block selection signal BLSk in response to a part (e.g., DRA01 and DRA0B1) of the decoded row addresses received from the row predecoder 120 while the detection signal DETIOD is inactive. The block selecting circuit 130, therefore, is disabled when the signal DETIOD is active at a logic high voltage level and thus the signal BLSk is inactive at a logic low voltage level. This results in the bit line precharge signal generating circuit 150 being activated by the disabled block section signal BLSk.

Figure 7:
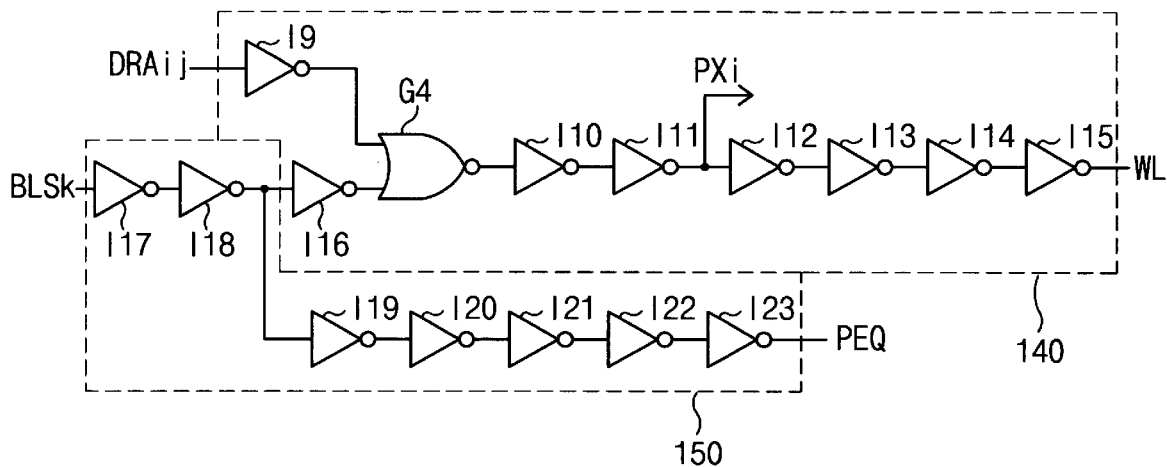
FIG. 7 is a detailed circuit diagram of a row decoder and a bit line precharge signal generating circuit for the semiconductor memory device shown in FIG. 3.

In FIG. 7, the row decoder 140 and the bit line precharge signal generating circuit 150 are shown in detail. Referring to FIG. 7, the decoder 140 is comprised of eight inverters I9 to I16 and a NOR gate G4. The bit line precharge signal generating circuit 150 generates the bit line precharge control signal PEQ in response to the block selection signal BLSk generated by the block selecting circuit 130. The bit line precharge signal generating circuit 150 comprises seven serially connected inverters I17 to I23 and serves as a delay circuit. The row decoder 140 decodes the block selection signal BLSk from the row predecoder 120 and the signal DRAij from the block selecting circuit 130 so as to activate a word line WL (i.e., row).

Figure 8:
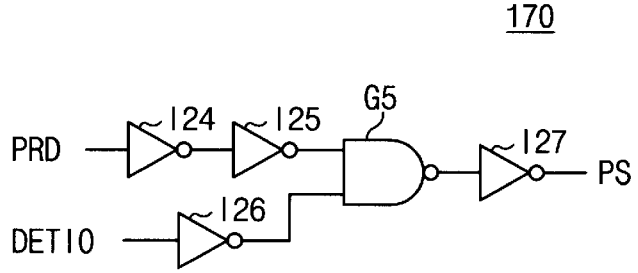
FIG. 8 is a detailed circuit diagram of a sensing control signal generating circuit for the semiconductor memory device shown in FIG. 3.
Figure 9:
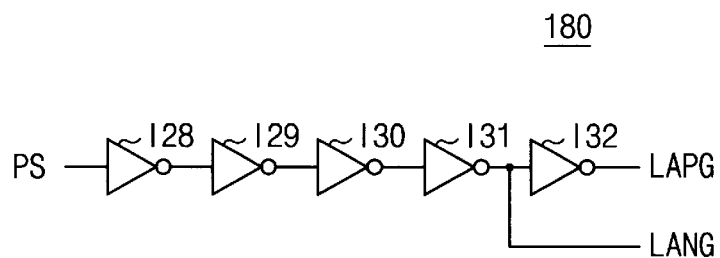
FIG. 9 is a detailed circuit diagram of a sensing enable signal generating circuit for the semiconductor memory device shown in FIG. 3.

FIG. 8 shows a detailed construction of the sensing control signal generating circuit 170 in FIG. 3. Referring to FIG. 8, the sensing control signal circuit 170 comprises four inverters I24 to I27 and a NAND gate G5. While the detection signal DETIO is at a logic low voltage level, the sensing control signal generating circuit 170 generates a sensing control signal PS having a logic high voltage level. The sensing control signal is synchronized with the signal PRD and indicates a period during which a sensing operation of the addressed memory cell is performed. The sensing control signal generating circuit 170 is inactivated when the detection signal DETIO is changed into a logic high voltage level such that the sensing enable signal generating circuit 180 and the sense amplifier 234 are disabled. FIG. 9 shows the sensing enable signal generating circuit 180 in detail. As shown in FIG. 9, the circuit 180 comprises five serially connected inverters I28 to I32 and generates two complementary sensing enable signals LANG and LAPG.

Figure 10:
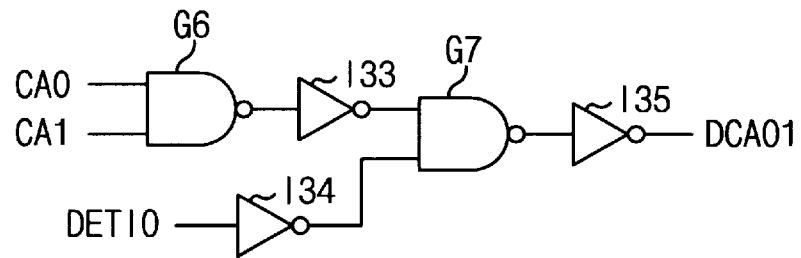
FIG. 10 is a detailed circuit of a main column decoder for the semiconductor memory device shown in FIG. 3.

FIG. 10 is a detailed circuit diagram of the main column decoder 200. As shown in FIG. 10, the main column decoder 200 includes three inverters I33 to I35 and two NAND gates G6 and G7. When the detection signal DETIO generated by the column detecting circuit 300 is disabled, the main column decoder 200 generates a signal DCAij (e.g., DCA01, DCA0B1, DCA01B, or DCA0B1B) by decoding a part (e.g., CA0 and CA1, CA0B and CA1, DCA0 and DCA1B, or DCA0B and DCA1B) of column addresses Ca1. The signal DCAij indicates global selection information for selecting one of the global column logic high voltage level the main column decoder 200 is disabled.

Figure 11:
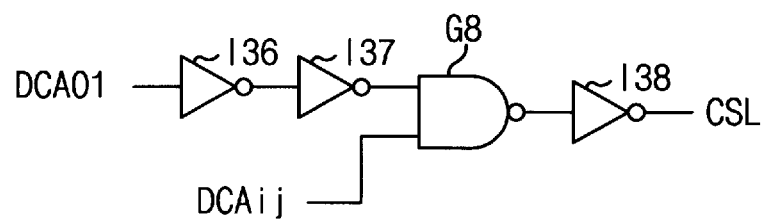
FIG. 11 is a detailed circuit diagram of a column decoder for the semiconductor memory device shown in FIG. 3.

A detailed circuit of the column decoder 220 is shown in FIG. 11. The column decoder 220 selects and drives a column selection line CSL in response to the signal DCA01 received from the main column decoder 200 and an arbitrary signal DCAij (e.g., DCA01, DCA0B1, DCA01B, or DCA0B1B) received from the column predecoder 210. The signal DCA01 indicates global selection information for selecting one of the global column selection lines. The signal DCAij indicates local selection information for selecting one of the local column selection lines corresponding to the selected global column selection line.

Figure 12:
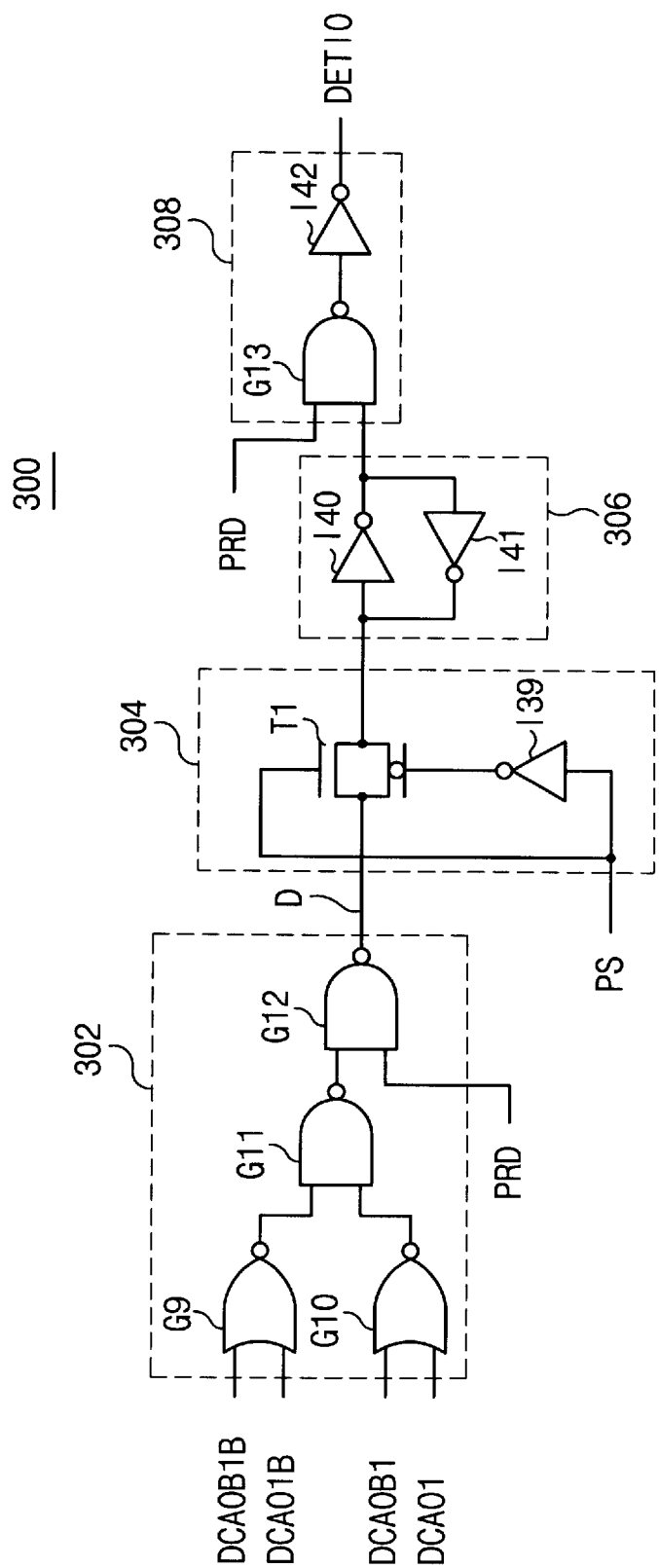
FIG. 12 is a detailed circuit diagram of a column detecting circuit for the semiconductor memory device shown in FIG. 3.

FIG. 12 is a detailed circuit of the column detecting circuit 300. Referring to FIG. 12, while the master clock signal PRD synchronized with a row address strobe RASB signal arranges to a logic high voltage level, the column detecting circuit 300 generates the detection signal DETIO in accordance with the combination of the signals DCA01, DCA0B1, DCA01B, and DCA0B1B. The circuit 300 is comprised of a first logic circuit 302, a switching circuit 304, a latch circuit 306, and a second logic circuit 308. The first logic circuit 302 comprise two NOR gates G9 and G10 and two NAND gates G11 and G12. The first logic circuit 302 generates a logic signal D in response to the signal PRD received from the master clock generating circuit 160 and the decoded signals DCA0B1B, DCA0B1, DCA01 and DCA01B received from the main column decoder 200. The switching circuit 304 comprises a transmission gate T1 and an inverter I39. The switching circuit 304 transfers the logic signal D into the latch circuit 306 in response to the sensing control signal PS from the sensing control signal generating circuit 170. The second logic circuit 308 comprises a NAND gate G13 and an inverter I42. The second logic circuit 308 generates a logic signal as the detection signal DETIO in response to the signal PRD and the output signal of the latch circuit 306. After the signal DCA01 is enabled and after the bit line voltage levels amplified by a sense amplifier change to voltage levels high enough to be sensed as a valid data by external circuitry, the detecting circuit 300 outputs the detection signal DETIO having a logic high voltage level.

When at least one of the decoded signals DCA01, DCA0B1, DCA01B, and DCA0B1B is enabled while the master clock PRD is enabled, the first logic circuit 302 outputs a logic signal D having a logic low voltage level. At this time, if the sensing control signal PS is at a logic high voltage level, the logic signal D having a low voltage level is transferred to the latch circuit 306. Thereafter, since the master clock signal PRD continues to be at a logic low level and the output of the latch circuit 306 is at a logic high voltage level, the second logic circuit 308 outputs a detection signal DETIO is at a logic high voltage level.

When the detection signal DETIO is at a high logic voltage level, the block selecting circuit 130 and the sensing control signal generating circuit 170 are disabled. This, in turn, disables the sensing enable signal generating circuit 180 and the sense amplifier disabled and enables the bit line precharge signal generating circuit 150. Thus, current consumed by the sense amplifier is reduced during a reading operation of the data stored in the addressed memory cell. The bit line precharge time is also shortened.

Figure 13:
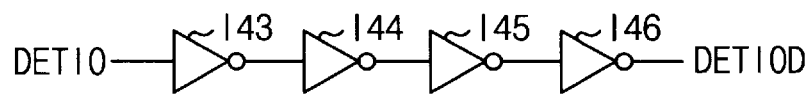
FIG. 13 is a detailed circuit diagram of a delay circuit for the semiconductor memory device shown in FIG. 3.

FIG. 13 is a detailed circuit showing a delay circuit in accordance with the preferred embodiment of the present invention. As shown in FIG. 13, the delay circuit 400 comprises four serially connected inverters I43 to I46.

Figure 14:
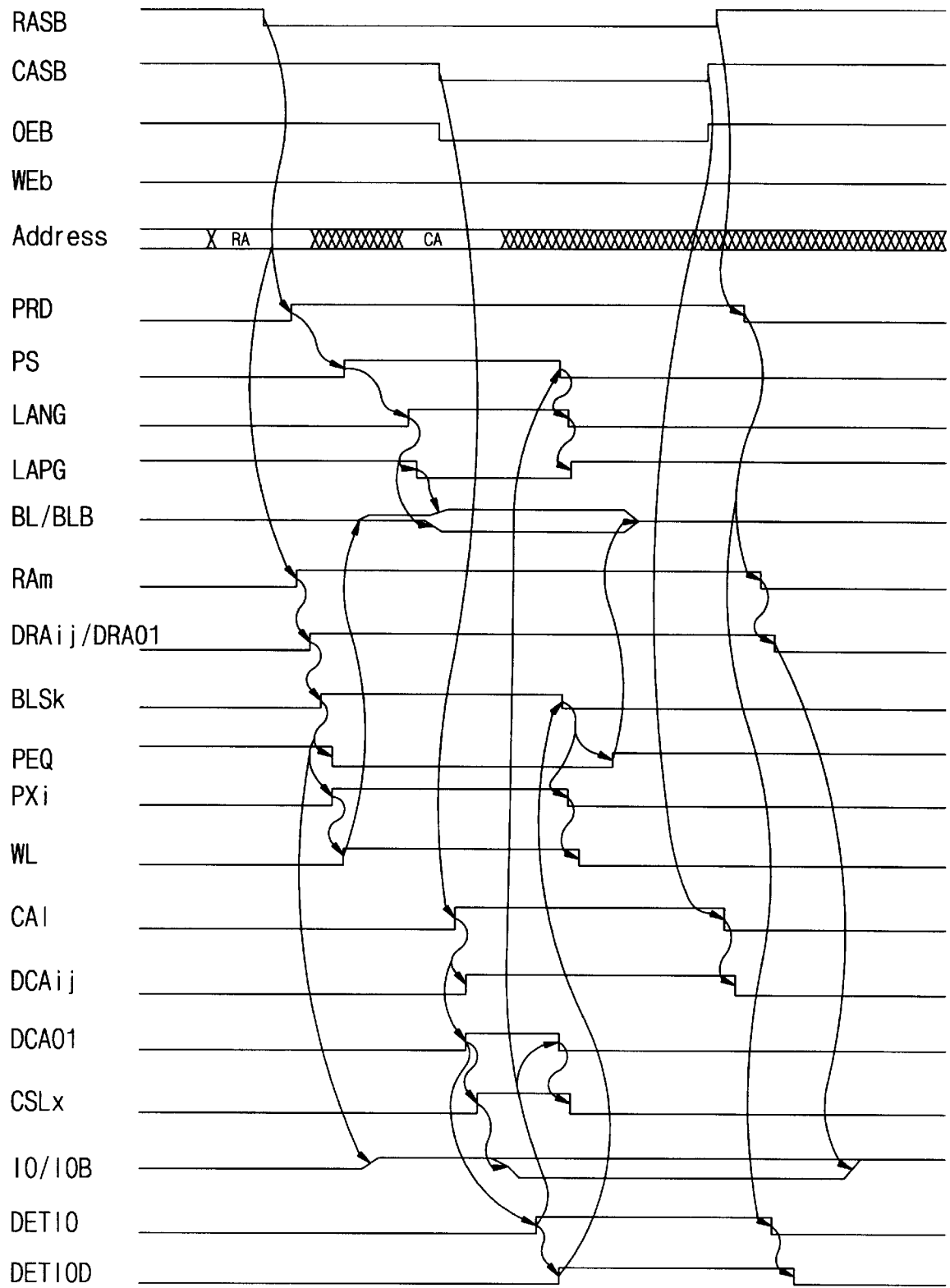
FIG. 14 is a timing diagram of a reading operation for the semiconductor memory device of the present invention.

A timing diagram of the reading operation in accordance with the present invention is shown in FIG. 14. The reading operation of the present invention will be described below in accordance with FIGS. 3 to 14. As shown in FIG. 14, after a column address strobe CASB signal is activated, a column selection signal CSLx is activated. And after a predetermined time elapses, that is, when cell data sensed and amplified by sense amplifier 234 can be externally sensed as a valid data, the detecting circuit 300 outputs a logic high detection signal DETIO. The sensing control signal generating circuit 170 is disabled by the logic high detection signal DETIO causing the sensing enable signal generating circuit 180 to disable the sense amplifier 234. Also, the block selecting circuit 130 is disabled by the logic high detection signal DETIO, and activates the bit line precharging and equalizing section 232 in the bit line precharge signal generating circuit 150. Thus, although the row address strobe signal RASB and the column address strobe signal CASB are enabled, current consumed by the sense amplifier 234 is reduced because sensing by the sense amplifier ends. Furthermore, since bit lines in a memory cell array 100 are precharged and equalized by the bit line precharging and equalizing section 232 during the reading operation, the bit line precharge time is shortened.

When the delayed detection signal DETIOD is generated by the delay circuit 400, the column main decoder 200 is disabled by the delayed detection signal DETIOD. This forces the column decoder 220 to disable the signal CSLx. Thereafter, as depicted in FIG. 14, when the column address strobe CASB signal is disabled, the signals CA1, DCAij related to column selection operation are disabled. Also, when the row address strobe RASB signal are disabled, the signals PRD, RAm and DRAij related to row selection operation are disabled. Finally, when the signals DETIO and DETIOD are disabled by the inactivated row address strobe RASB signal, the data reading operation ends.

Figure 15:
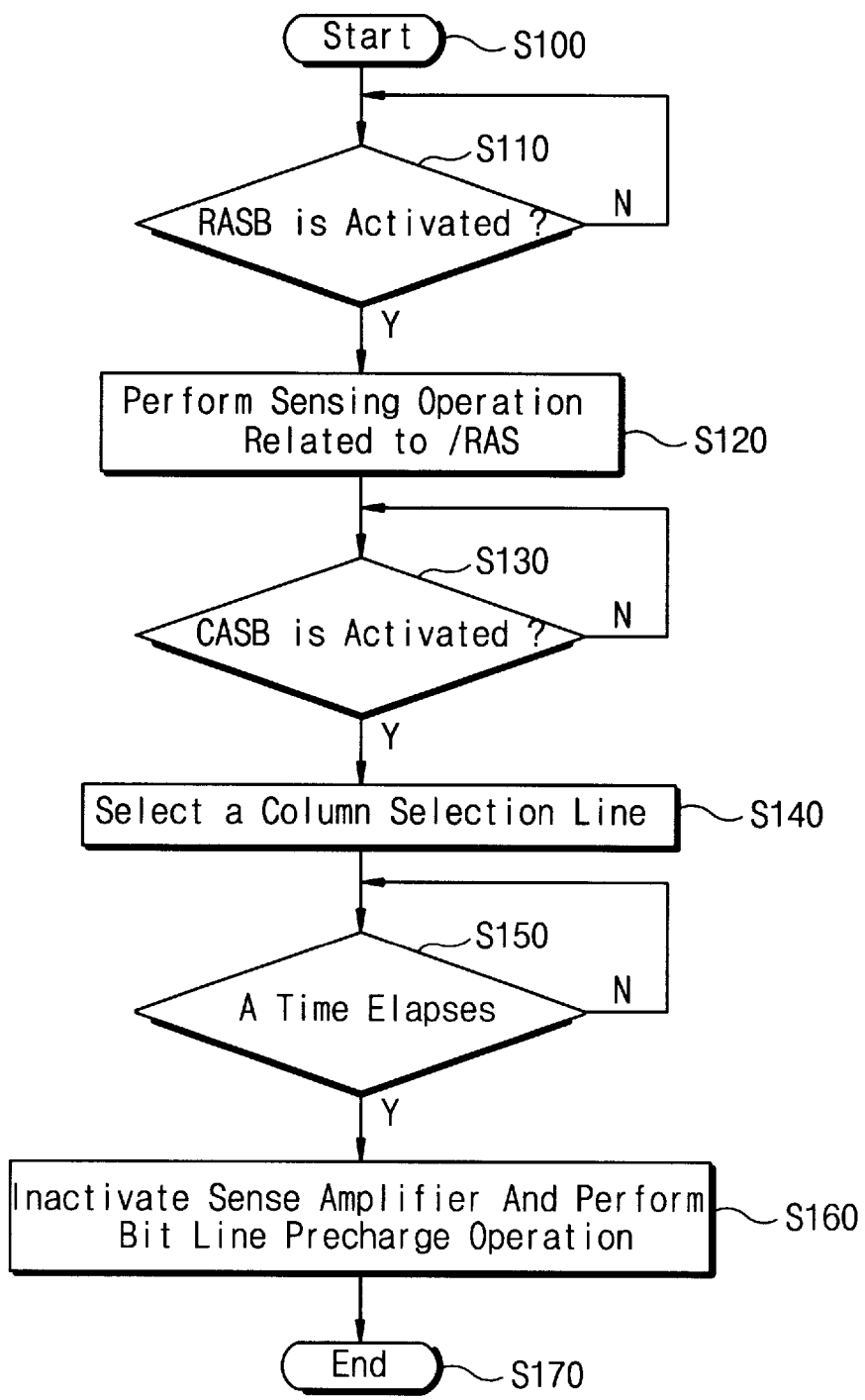
FIG. 15 is a flow diagram of a reading operation for the semiconductor memory device of the present invention.

FIG. 15 is a flow diagram showing the reading operation in accordance with a preferred embodiment of the present invention. Referring to FIGS. 3, 13, and 15, in step S110, the row address strobe RASB signal is checked to determine whether it is active. The signal RASB is disabled or inactive, if step S110 is repeated. Otherwise, a sensing operation related to the signal RASB (refer to FIG. 14) is performed at step S 120. In step S130, the column address strobe CASB is checked to determine whether it is active. If the signal CASB is disabled, step S130 is repeated. Otherwise, a column selection line CSLx (i.e., a local column selection line) is selected at step S140 (refer to FIG. 14). In step S150, it is checked whether a predetermined time has elapsed. The predetermined time is the time it takes for the voltage levels on the I/O lines IO and IOB related to the addressed memory cell to develop to voltage levels capable of being sensed as a valid data by external circuitry. If not, step S150 is repeated. Otherwise, a sense amplifier is inactivated and the bit line precharge operation is performed at step S160.

Having illustrated and described the principles of my invention in a preferred embodiment thereof, it should be readily apparent to those skilled in the art that the invention can be modified in arrangement and detail without departing from such principles. I claim all modifications coming within the spirit and scope of the following claims.

I claim:

1. A semiconductor memory device, comprising:
   a memory cell array having a plurality of blocks, each block having a plurality of memory cells arranged in rows and columns;
   a plurality of first column selection lines corresponding to the memory cell array;
   a plurality of second column selection lines corresponding to each block of the plurality of blocks in the memory cell array;
   a decoding means for decoding a column address for one of the plurality of second column selection lines and for generating a first and second column selection signals;
   a selecting means for selecting the addressed column in response to the first and second column selection signals;
   a sense amplifier means for sensing and amplifying data stored in an addressed memory cell responsive to sensing enable signals, the addressed memory cell corresponding to a row address and the column address;
   a sensing control signal generating means for generating a sensing control signal responsive to a pulse signal, the pulse signal being synchronized with a row address strobe signal and the sensing control signal indicating a sensing period during which a sensing operation is performed on the addressed memory cell;
   a sensing enable signal generating means for generating the sensing enable signals responsive to the sensing control signal;
   a detecting means for generating a detection signal responsive to the first column selection signal;
   wherein the sensing control signal generating means and the sensing enable signal generating means are disabled by the detection signal while the row address strobe signal is enabled.

2. The semiconductor memory device according to claim 1 wherein the detecting means comprises:
   a first logic circuit for generating a logic signal by logically combining the second column selection signal and the pulse signal;
   a switching circuit for selectively transferring the logic signal responsive to the sensing control signal;
   a latch circuit for latching the logic signal transferred through the switching circuit; and
   a second logic circuit connected to the latch for generating the detection signal by logically combining the logic signal and the pulse signal.

3. A semiconductor memory device, comprising:
   a memory cell array having a plurality of blocks, each block having a plurality of rows, a plurality of columns, and a plurality of memory cells formed at intersections of the rows and columns;
   a plurality of first column selection lines corresponding to the memory cell array;
   a plurality of second column selection lines corresponding to each block wherein proportion of the first column selection lines to the second column selection lines is 1:n;
   a first decoding means for generating a first and a second row selection signal by decoding a row address corresponding to one of the plurality of rows;
   a row selecting means for selecting the addressed row responsive to the first and second row selection signals;
   a second decoding means for generating a first and a second column selection signal by decoding a column address corresponding to one of the plurality of second column selection lines;
   a column selecting means for selecting one of the plurality of second column selection lines responsive to the first and second column selection signals;
   a sense amplifier means for sensing and amplifying data stored in an addressed memory cell related to the row and column addresses responsive to sensing enable signals;
   a sensing control signal generating means for generating a sensing control signal responsive to a pulse signal, the pulse signal being synchronized with a row address strobe signal and the sensing control signal indicating a sensing period during which a sensing operation is performed on the addressed memory cell;
   a sensing enable signal generating means for generating the sensing enable signals responsive to the sensing control signal; and
   a detecting means for detecting whether the first column selection signal is enabled and generating a detection signal when a voltage level on an IO line corresponding to the selected column is capable of being sensed as valid data by external circuitry;
   wherein the sensing control signal generating means and the second decoding means are disabled by the detection signal while the row address strobe signal is enabled.

4. The semiconductor memory device according to claim 3 further comprising:
   a delay means for generating a delayed detection signal by delaying the detection signal;
   a precharge signal generating means for generating a precharge signal when the first selection signal is disabled by the delayed detection signal; and
   a precharge means for precharging the columns in the selected block at a precharge level responsive to the precharge signal before the sensing operation is performed on the addressed memory cell.

5. A reading method for a semiconductor memory device, the memory device including a memory cell array having a plurality of memory cells arranged in rows and columns, the reading method comprising:
   detecting an enabled row address strobe signal, the row address strobe signal indicating that a row address for addressing one of the rows is input;
   activating the addressed row and a sense amplifier corresponding to the addressed row responsive to detecting the row address strobe signal;

detecting an enabled column address strobe signal, the column address strobe signal indicating that a column address is input;

sensing data stored in an memory cell corresponding to the addressed row and column;

selecting a column selection line corresponding to the column address;

detecting a voltage level on a I/O line corresponding to the selected column selection line capable of being sensed as a valid data by external circuitry; and disabling the sense amplifier while the row address strobe and the column address strobe signals are enabled responsive to a detection signal.

6. The method according to claim 5 further comprising precharging the columns to a predetermined precharge voltage level after the sense amplifier is disabled and while the row and column address strobe signals are enabled.

7. The semiconductor memory device according to claim 2 wherein the decoding means decodes the column address responsive to the detection signal.

8. The semiconductor memory device according to claim 2 including a delaying means coupled to the detecting means for delaying the detection signal.

9. The semiconductor memory device according to claim 8 including a block selecting means for selecting a block from the plurality of blocks responsive to the delayed detection signal.

10. The semiconductor memory device according to claim 9 including:

a precharge signal generating means for generating a precharge signal responsive to the delayed detection signal; and a precharge means for precharging the columns in the selected block at a precharge level responsive to the precharge signal before the sensing operation is performed on the addressed memory cell.

11. The semiconductor memory device according to claim 4 including a block selecting circuit for selecting a block of memory cells responsive to the delayed detection signal and the first row selection signal.

12. The semiconductor memory device according to claim 11 wherein the detecting means includes:

a first logic circuit for generating a logic signal responsive to the first column selection signal;

a transmission circuit for transmitting the logic signal from an input terminal to an output terminal responsive to the sensing control signal;

a latch for latching the transmitted logic signal; and a second logic circuit for generating the detection signal responsive to the pulse signal.

13. The reading method according to claim 6 including delaying the detection signal.

14. The reading method according to claim 13 including selecting a block of memory cells responsive to the delayed detection signal.

* * * * *

UNITED STATES PATENT AND TRADEMARK OFFICE
CERTIFICATE OF CORRECTION

PATENT NO.  : 5,883,851
DATED       : March 16, 1999
INVENTOR(S) : Lee

It is certified that error appears in the above-identified patent and that said Letters Patent is hereby corrected as shown below:

Column 5,
Line 52, "P/O" should read -- I/O --.

Column 6,
Line 48, "19" should read -- I9 --.
Line 49, "116" should read -- I16 --.

Column 7,
Line 19, "Ca1" should read -- Cal --.

Signed and Sealed this

Seventeenth Day of September, 2002

Attest:

JAMES E. ROGAN
Attesting Officer    Director of the United States Patent and Trademark Office